United States Patent [19]

Harrop

[11] Patent Number: 4,479,260
[45] Date of Patent: Oct. 23, 1984

[54] COUPLING AND MIXING CIRCUIT COMPRISING A DUAL SOURCE TRANSISTOR

[75] Inventor: Peter Harrop, Yerres, France

[73] Assignee: U.S. Philips Corporation, New York, N.Y.

[21] Appl. No.: 442,551

[22] Filed: Nov. 18, 1982

[30] Foreign Application Priority Data

Nov. 27, 1981 [FR] France ................. 81 22253

[51] Int. Cl.³ ..................... H04B 1/26; H01L 29/76
[52] U.S. Cl. ................................. 455/333; 307/304
[58] Field of Search ............... 455/333; 307/304, 448, 307/449, 468, 501; 328/159, 158; 330/69, 253; 357/22, 23

[56] References Cited

U.S. PATENT DOCUMENTS 3,478,229 11/1969 Avery .................................. 307/468
3,581,211 5/1971 Maitland et al. .................... 455/333
4,219,828 8/1980 Lardy et al. .......................... 357/23

OTHER PUBLICATIONS

"Summing Circuit for Analog Levels"—A. Falcoz et al., IBM Technical Disclosure Bulletin, vol. 18, No. 6, Nov., 1975, pp. 1900-1901.

*Primary Examiner*—Marc E. Bookbinder
*Attorney, Agent, or Firm*—Robert J. Kraus

[57] ABSTRACT

A dual-source F.E.T. connected in a common gate arrangement for receiving respective input signals at the two-sources and for producing at a drain terminal the sum of the input signals. A circuit is disclosed which combines the dual-source F.E.T. with a single-source F.E.T. for mixing the input signals.

3 Claims, 6 Drawing Figures

COUPLING AND MIXING CIRCUIT COMPRISING A DUAL SOURCE TRANSISTOR

BACKGROUND OF THE INVENTION

The invention relates to a coupling circuit of the type comprising two inputs and one output, by means of which an output signal is obtained, which is the sum of the two input signals; the invention further relates to a coupling and mixing circuit, by means of which an output signal is obtained which is the mixed product of the two input signals.

The invention applies to transmissions of signals, for example, by means of artificial satellites, and in particular to circuits for receiving and processing these signals. The circuit in accordance with the invention serves for the transposition of frequencies to be effected between the emission frequency of the signals (for example, for broadcasting systems using artificial satellites, this frequency may lie between 11.5 and 12.5 GHz) and an intermediate frequency (for example, of 1 GHz, for the same systems).

The choice of the frequencies for the broadcasting systems (and more generally even telecommunication systems) is determined by the environment in which these signals will be emitted and by the power available in the transmitter station. The quality of a signal is only acceptable when the ratio between the level of the useful signal and the disturbing noise level is sufficiently large. A part of this noise is received by the receiving antenna, whilst another part is produced in the receiver. The noise received by the antenna can be reduced only by a suitable choice of the frequencies.

The operating frequencies are therefore chosen in the radio-frequency ranges roughly between 0.5 and 50 GHz. The frequency bands recently allocated by the CCIR for broadcasting through artificial satellites lie between 11.7 and 12.5 GHz.

The high-frequency signal emitted by the satellite is received on the earth by a communal or individual station and converted into a signal of lower frequency in order that it may be accepted by a standard television apparatus. In fact this frequency change takes place in several steps: A first frequency change from the emission frequency (12 GHz) to an intermediate frequency (1 GHz), while other frequency changes take place later on to the frequency of approximately 130 MHz, at which the frequency demodulation and the amplitude modulation of a carrier frequency to be applied to a standard television receiver are effected.

According to the prior art, the frequency changes were effected by means of a Schottky diode of high cut-off frequency or, for example, a field effect transistor followed by a suitable filter for selecting the desired frequency from the various frequencies present at the output. Such a construction included transmission lines, for example, of the microstrip type, and coupling means for delivering the signals to be mixed at the input of the said diode.

Such a construction has the great disadvantage that it is of too large a size.

SUMMARY OF THE INVENTION

The present invention has for its object to mitigate the above-mentioned disadvantage and to provide a solution according to a monolithic technology. In accordance with the invention, a dual source field effect transistor is connected in a common gate arrangement while the two input signals are applied to the two source electrodes and the output is obtained from the drain electrode.

BRIEF DESCRIPTION OF THE FIGURES

The following description with reference to the accompanying drawing, given by way of non-limiting example, permits of understanding and evaluating more clearly the scope of the invention.

DETAILED DESCRIPTION OF THE PREFERRED EMBODIMENT

Figure 1:
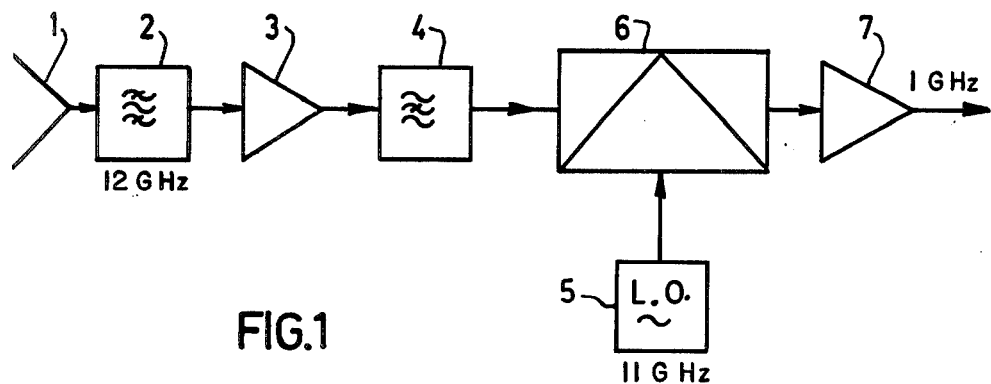
FIG. 1 shows a synoptical diagram of the reception and frequency transposition of a signal.

The schematic diagram of FIG. 1 shows a device for reception and frequency-transposition of a signal received, for example, from a satellite, which device is generally disposed in the proximity of the antenna in what is usually designated as the "receiving head". This device therefore comprises an antenna 1 in the form of a parabolic reflector having a diameter of approximately one meter, in the focus of which the afore-mentioned receiving head is present. The device also includes a band-pass filter 2, a preamplifier (12 GHz) denoted by 3, a frequency rejection filter 4, by means of which the transmission of undesired signals of parasitic frequencies is avoided, a mixer 6, to another input of which the signal (of 11 GHz) from a local oscillator 5, for example, a field effect transistor, is applied, and an intermediate frequency amplifier 7 (1 GHz).

Figure 2:
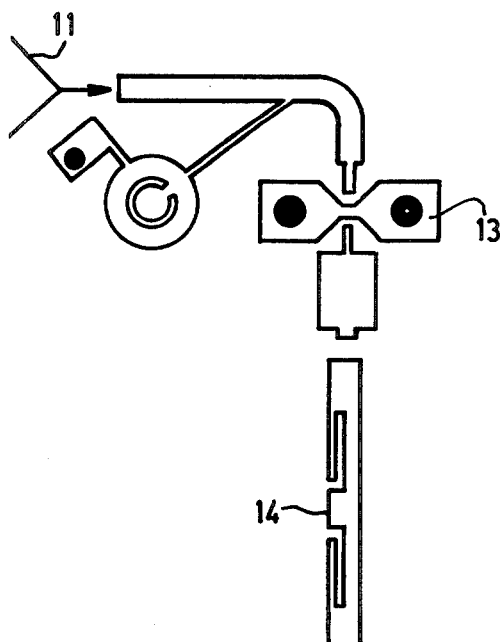
FIG. 2 shows a construction according to the prior art of this circuit.
Figure 2:
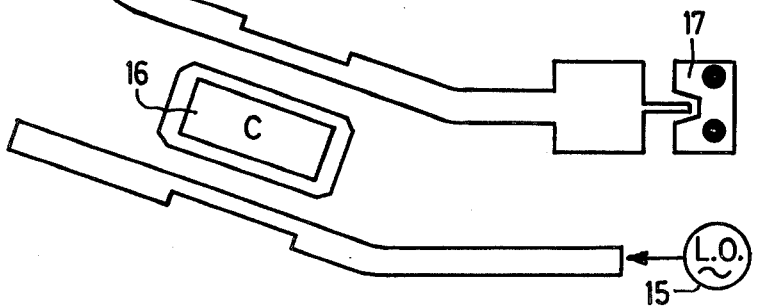

A construction according to the prior art of this circuit is shown in FIG. 2. On a support of, for example, alumina there is formed according to the known microstrip technology a first transmission line, to which the signal originating from the antenna 11 is applied. This signal is applied to the gate of a field effect transistor 13, the source of which is connected to earth through two metallized holes. The bias voltage is applied to this transistor 13 through a filter of circular structure, as described in the prior French Patent Application No. 7916260, filed on June 25, 1979 by the Applicant, which corresponds to U.S. Pat. No. 4,327,342. In order to minimize the noise, an impedance matching is realized in the form of a narrow line of high impedance followed by a quarter-wave line of low impedance. A band-stop filter 14 is provided in the form of a spur-line filter. A second transmission line has applied to it the signal originating from the local oscillator 15. This signal is coupled by means of a directional coupler 16 and the two signals are applied on the second transmission line to the gate electrode of a field effect transistor 17, in which the two signals are mixed.

Further information about the prior art may be found in the article entitled: "Low-noise 12 GHz front end designs for direct satellite television reception" by P. HARROP, P. LESARTRE and T. H. A. M. VLEK in "Philips TECHNICAL REVIEW" Vol. 39, 1980, No. 10. A special method of constructing these "spur-line filters" is described in a prior French Patent Application, filed in the name of the Applicant under No. 80 05 181 on March 7, 1980.

This construction according to the prior art has the great disadvantage that it has too large a size. The integration of the receiving heads makes it necessary to conceive monolithic techniques for a total integration on a substrate of gallium arsenide. The invention has for its object to mitigate this disadvantage and provides a more compact construction.

Figure 3:
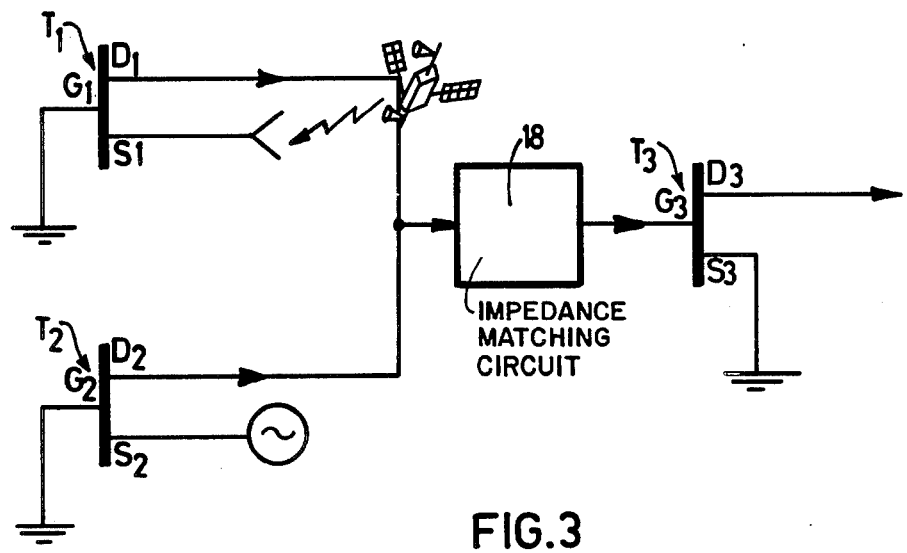
FIG. 3 shows the construction of a circuit for coupling and mixing two signals.

FIG. 3 shows the combination and mixing circuit, which is realized with the aid of field effect transistors. The signals to be combined are applied to the sources $S_1$ and $S_2$ of the two field effect transistors $T_1$ and $T_2$, connected in common gate arrangement. The signals recovered at the drain electrodes $D_1$ and $D_2$ are applied together to the gate electrode $G_3$ of a field effect transistor $T_3$ connected in common source arrangement.

The first stage of this circuit, which is constituted by the two transistors $T_1$ and $T_2$ connected in common gate arrangement, provides an impedance matching such that the two signals, one of which originates, for example, from the satellite and has a frequency of 12 GHz and the other originates, for example, from a local oscillator and has a frequency of 11 GHz, are each applied to a circuit, the input impedance of which is approximately equal to the characteristic impedance of 50Ω, whilst the output impedance of these circuits is very high.

An impedance matching denoted by 18 is necessary to obtain an optimum transmission of energy between the two stages.

The second stage of this circuit, which is constituted by the field effect transistor $T_3$ connected in common source arrangement, permits of achieving when it is suitably biassed, that the two signals are mixed, a work point being situated in a non-linear part of its characteristic curve $I_D = f(V_{GS})$. The signal recovered at the drain electrode $D_3$ has then to be filtered so that only the signal of the desired frequency is retained, which in the present case is the signal the frequency of which is the difference of the frequencies of the two signals applied to the input and in this special case amounts to 1 GHz. It should be appreciated that these numbers are given only by way of example and should not be considered in any case as a limitation of the present invention.

Figure 4:
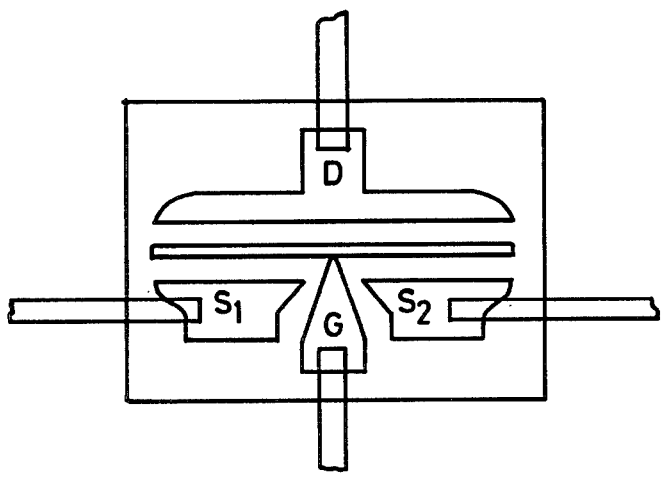
FIG. 4 shows a dual source transistor.

FIG. 4 shows a known component, namely a dual source transistor. This transistor is known, for example, from the article entitled "Low-noise microwave GaAs field effect transistor" by P. BAUDET, M. BINET and D. BOCCON-GIBOD in "PHILIPS TECHNICAL REVIEW", volume 39, no. 10, pp. 269–276, especially from FIG. 1 of this article.

However, though this component is known, it has never been conceived that different signals could be applied to the two source electrodes. This novel structure and the resulting technology have only been used to reduce the gate resistance, either by connecting two gate portions in parallel or by establishing a contact at the centre of the gate.

The main idea of the invention consists in the novel application of two signals of different frequencies to this known component so that at the drain electrode there is recovered a signal which is the additive combination of the two signals applied to the two source electrodes.

Figure 5:
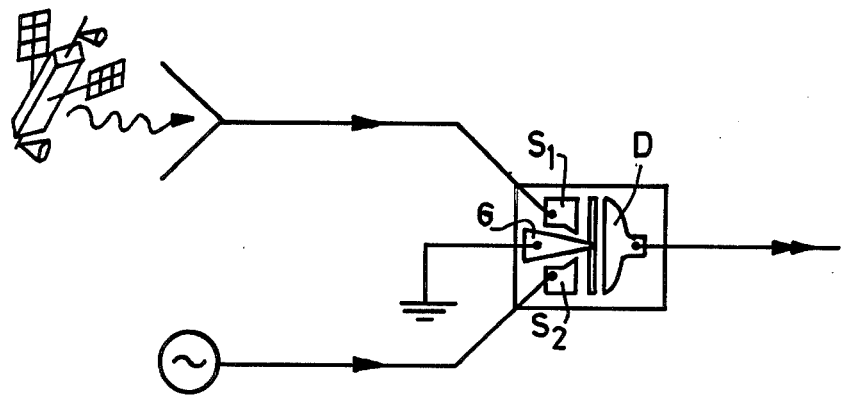
FIG. 5 shows a coupling circuit according to the present invention.

FIG. 5 shows a coupling circuit according to the present invention. To the two source electrodes $S_1$ and $S_2$ of this transistor DSFET ("Dual-Source Field Effect Transistor"), are applied the two signals originating from the satellite (12 GHz) and from a local oscillator (11 GHz), while the gate electrode G is connected to ground, for example, through a metallized hole in the substrate and the signal thus combined is recovered at the drain electrode D.

Figure 6:
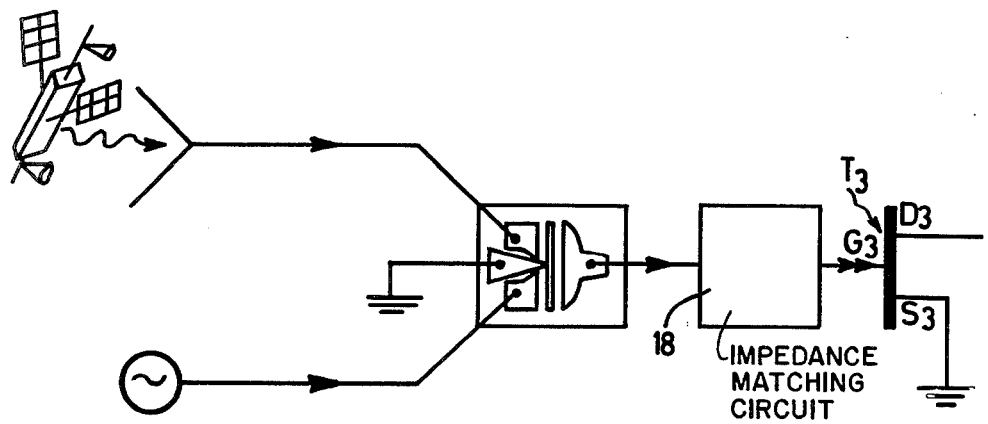
FIG. 6 shows a coupling and mixing circuit according to the present invention.

This signal can then be applied, for example, to the gate electrode of a field effect transistor $T_3$, as shown in FIG. 6. A matching circuit 18 ensures the optimum transmission of energy, while the signal thus mixed can be recovered at the drain electrode $D_3$. After filtering, the undesired frequencies are eliminated and in this example only the intermediate frequency of 1 GHz is retained.

It is clear to those skilled in the art that many modifications can be conceived without departing from the scope of the present invention, as defined by the following appended claims.

What is claimed is:

1. A coupling circuit comprising a dual source field effect transistor having first and second source electrodes for receiving first and second input signals, a gate electrode, and a drain electrode for providing an output signal, said transistor being connected in a common gate arrangement, said coupling circuit providing as said output signal the sum of said first and second input signals.

2. A coupling and mixing circuit comprising:
   (a) a first field effect transistor having first and second source electrodes for receiving first and second input signals, a gate electrode and a drain electrode for providing a first output signal, said first field effect transistor being connected in a common gate arrangement and providing as said first output signal the sum of the first and second input signals;
   (b) an impedance matching means having an input and an output, said input being coupled to the drain electrode of the first field effect transistor;
   (c) a second field effect transistor having a gate electrode coupled to the output of the impedance matching means, a drain electrode for providing a second output signal, and a source electrode, said second field effect transistor being connected in a common source arrangement and being biassed to effect a non-linear relationship between its drain current and its gate-to-source voltage.

3. A coupling circuit as in claim 1, characterized in that it is embodied in one semi-conductor body.

* * * * *